United States Patent [19]

Reilly

[11] Patent Number: 5,610,827
[45] Date of Patent: Mar. 11, 1997

[54] METHOD OF AND APPARATUS FOR PEAK AMPLITUDE DETECTION

[75] Inventor: Robert J. Reilly, Janesville, Wis.

[73] Assignee: SSI Technologies, Inc., Janesville, Wis.

[21] Appl. No.: 300,341

[22] Filed: Sep. 2, 1994

[51] Int. Cl.⁶ ......................................... G06F 15/20
[52] U.S. Cl. .......................................... 364/487; 364/552
[58] Field of Search ..................... 364/487, 551.01, 364/552, 565; 324/76.12

[56] References Cited

U.S. PATENT DOCUMENTS

| | | | |
|---|---|---|---|
| 3,845,465 | 10/1974 | Hosick et al. | 340/146.2 |
| 4,007,439 | 2/1977 | Semmelhaack et al. | 340/146.2 |
| 4,183,087 | 1/1980 | Huelsman | 364/515 |
| 4,192,003 | 3/1980 | Brock et al. | 364/487 |
| 4,658,368 | 4/1987 | Blais | 364/572 |
| 4,731,863 | 3/1988 | Sezan et al. | 364/414 |
| 4,819,197 | 4/1989 | Blais | 364/715.06 |
| 5,023,546 | 6/1991 | Pawiak et al. | 324/174 |
| 5,023,547 | 6/1991 | Pawiak et al. | 324/174 |
| 5,063,345 | 11/1991 | Akiyama | 324/173 |
| 5,274,569 | 12/1993 | Prasad | 364/486 |
| 5,319,583 | 6/1994 | Wildes | 364/724.01 |

OTHER PUBLICATIONS

Conte et al., Elementary Numerical Analysis, 1980, pp. 295–303.

*Primary Examiner*—Edward R. Cosimano
*Assistant Examiner*—Craig Steven Miller
*Attorney, Agent, or Firm*—Michael, Best & Friedrich

[57] ABSTRACT

The invention provides a method and apparatus for detecting maxima and minima of an array of data points defining a periodic, symmetrical waveform. The method comprises comparing the "y" values of two marker points (selected from the array of data points), which marker points are spaced apart along the waveform by a predetermined number of data points. If the "y" values of the two marker points are not substantially the same, both marker points are incremented in the "x" direction, and their "y" values are tested again. If the "y" values are substantially the same, within a predetermined tolerance value t, a positive or negative peak has been found. Optionally, the points between the marker points are then sorted to find the tip of the peak.

2 Claims, 4 Drawing Sheets

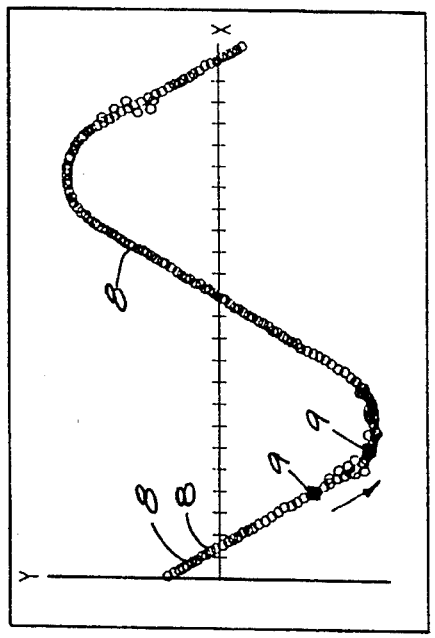
Fig. 1 MARKER POINTS APPROACHING A PEAK
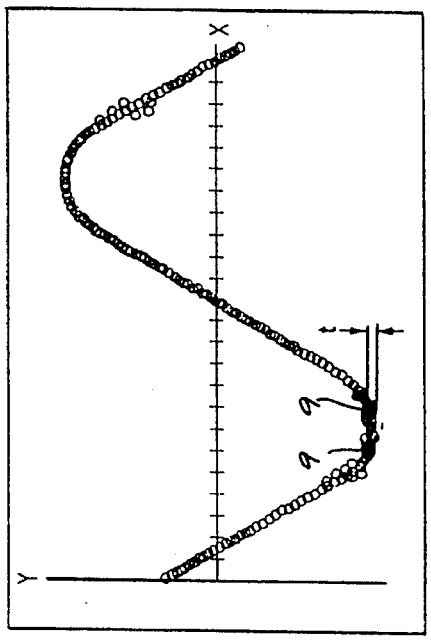
Fig. 2 MARKER POINTS STRADDLING A PEAK
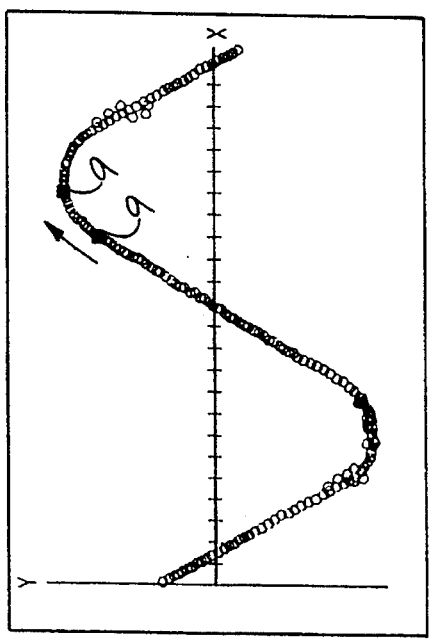
Fig. 3 MARKER POINTS JUMPED AHEAD TO BE NEAR NEXT PEAK

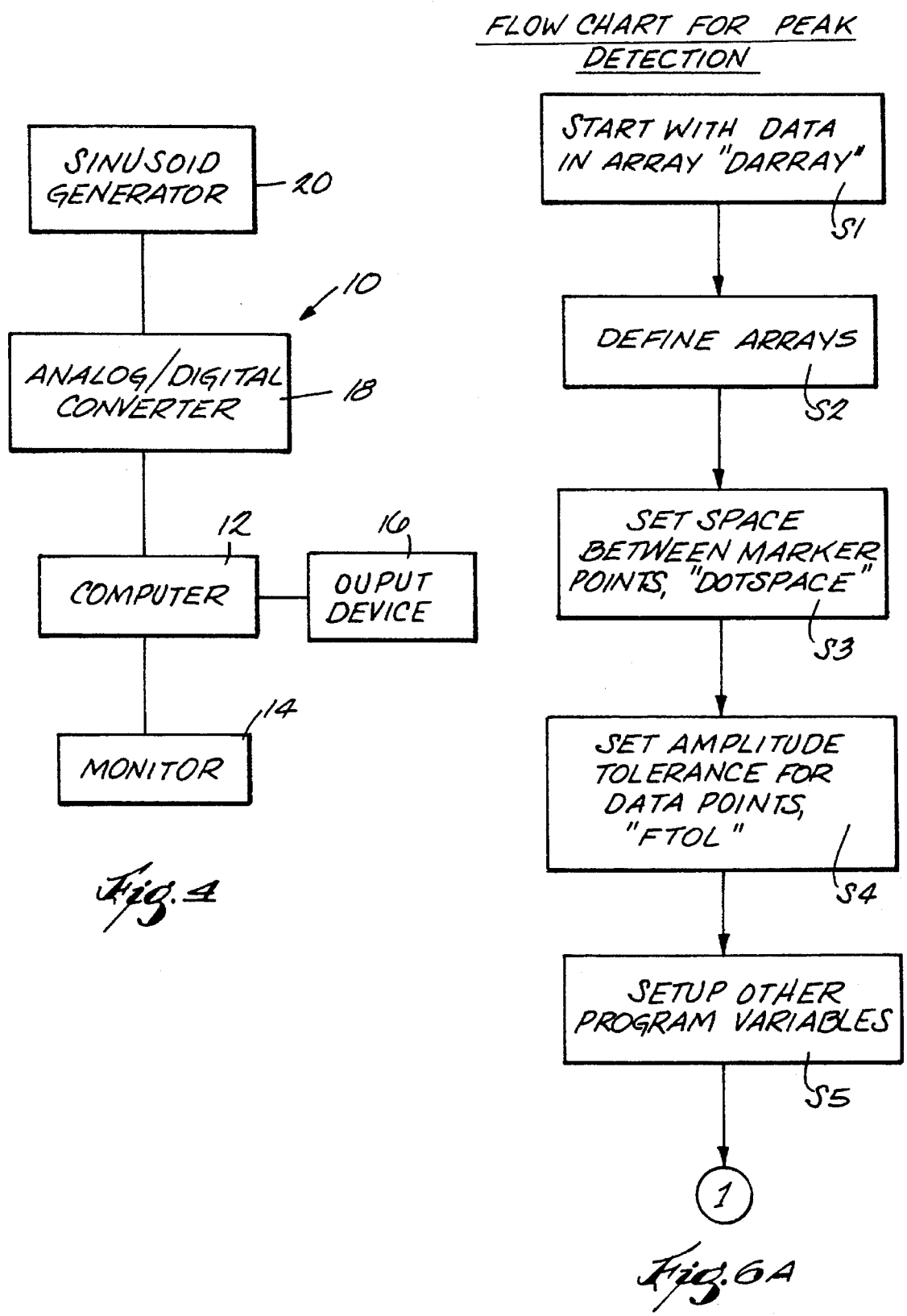

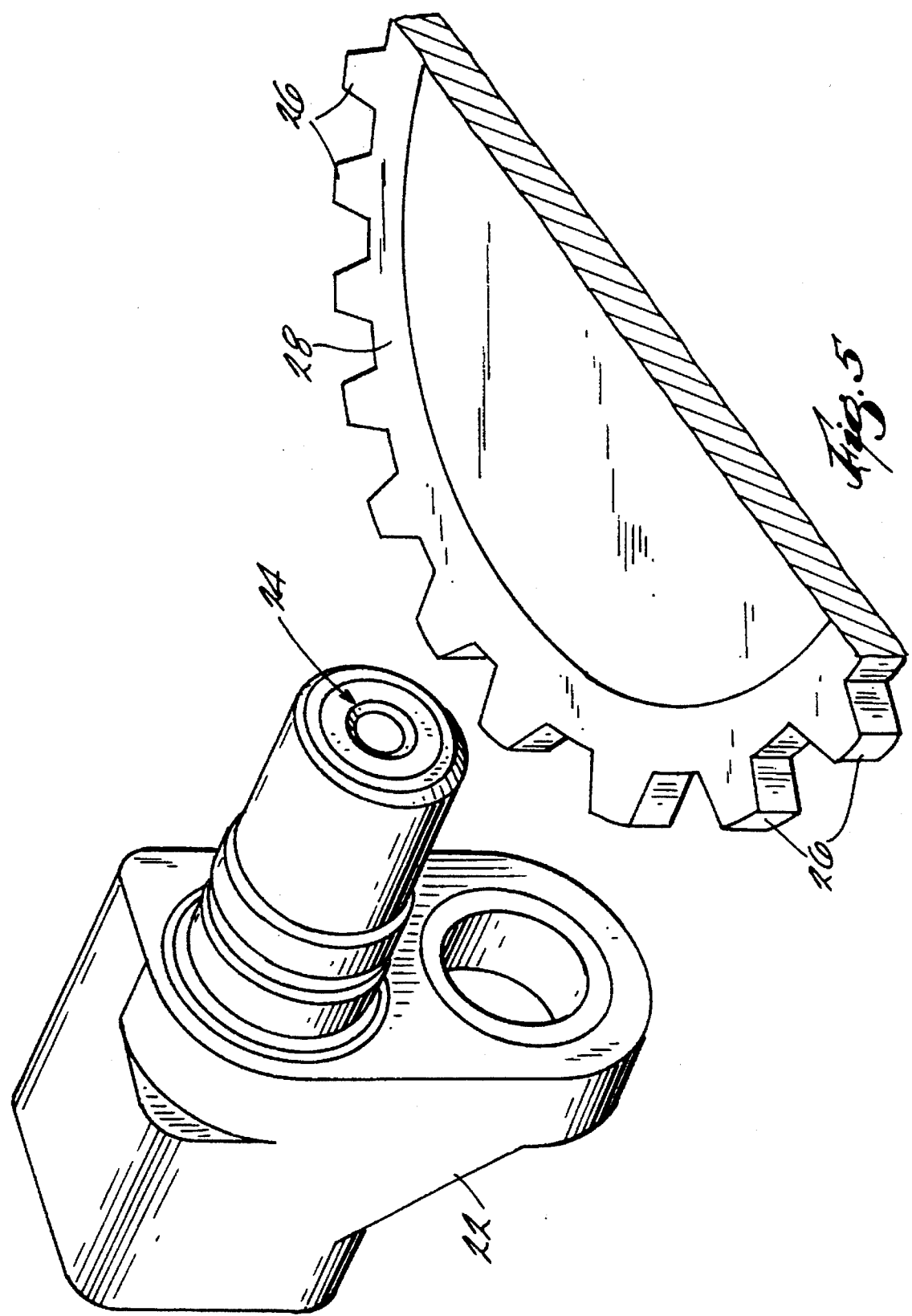

METHOD OF AND APPARATUS FOR PEAK AMPLITUDE DETECTION

BACKGROUND OF THE INVENTION

The invention relates to a method and apparatus for detecting maxima and minima.

Various methods are known for detecting determining maxima (positive peaks) or minima (negative peaks) in a series of data points that generally form a sinusoidal wave.

U.S. Pat. No. 5,274,569 discloses a peak detector which identifies two sequential sets of two successive samples each. The first set includes samples on the leading edge and on either side of a threshold voltage Vt. The second set includes samples on the falling edge an on either side of the threshold voltage Vt. For each of the two sets, the point at which the signal substantially equals the threshold Vt is found by interpolation. The peak is determined as being equidistant between the two threshold points.

U.S. Pat. No. 5,319,583 discloses a sliding window minimum filter. A buffer is provided containing signal values currently within the sliding window. The local minimum and maximum points are determined within the buffer. This patent does not suggest comparing two marker points within a window to each other to determine the presence or absence of a maximum or minimum.

U.S. Pat. No. 4,183,087 discloses peak deviating sampling in which periodic sampling is performed by taking successive samples during an interval, determining interval maximal and minimal samples and determining the deviation of each maximal and minimal from the last sampling interval.

SUMMARY OF THE INVENTION

The invention provides a method and apparatus for detecting maxima (positive peaks) and minima (negative peaks) of an array of data points defining a periodic, symmetrical waveform.

This information can be used in various applications. In one embodiment, this maxima and minima information is used in testing components that generate periodic, symmetrical waveforms. For example, this maxima and minima information can be used in testing variable reluctance speed sensors, such as those used in vehicle wheels in connection with anti-lock braking systems. An example of such a speed sensor is sold by the assignee of the present invention, SSI, under the part number C5305.3. Other examples of such speed sensors are disclosed in U.S. Pat. No. 5,063,345, issued to Akiyama on Nov. 5, 1991; U.S. Pat. No. 5,023,547, issued to Pawlak et al. on Jun. 11, 1991; and U.S. Pat. No. 5,023,546, issued to Pawlak et al. on Jun. 11, 1991. In testing these speed sensors, a peak to peak amplitude measurement is made between each positive peak and the immediately succeeding negative valley (or between each negative peak and the immediately succeeding positive peak). Either the maximum or minimum peak to peak amplitude encountered during the test (depending on which test a manufacturer wishes to employ) is compared to a predetermined threshold to determine if the component is acceptable or not. The system and method provides an indication, such as a visual or audio indication, as to whether the component is acceptable or not. For example, in one embodiment, if the component is acceptable, green is displayed on the screen of a computer monitor, and if the speed sensor is not acceptable, red is displayed on the screen of the computer monitor. The system and apparatus can be used to detect maxima and minima information for various other purposes.

The system and method compares the "y" values of two marker points (selected from the array of data points), which marker points are spaced apart in the "x" direction by a predetermined number of data points. If the "y" values of the two marker points are not substantially the same, both marker points are incremented in the "x" direction, and their "y" values are tested again. If the "y" values are substantially the same, within a predetermined tolerance value, a positive peak or negative peak has been found. The points between the marker points are then sorted to find the tip of the positive or negative peak. In a more particular embodiment of the invention, after a peak has been found, assuming that the waveform has a known frequency, the marker points can be jumped ahead to just before the next positive or negative peak.

Other features and advantages of the invention will become apparent to those of ordinary skill in the art upon review of the following detailed description, claims, and drawings.

BRIEF DESCRIPTION OF THE VIEWS OF THE DRAWINGS

FIGS. 1–3 illustrates a method of locating a peak of a sinusold defined by data points, in accordance with the invention.

FIG. 1 shows marker points, selected from among data points defining a sinusoid, employed in the method of the invention, approaching a peak.

FIG. 2 shows the marker points straddling a peak, having "y" values which are substantially similar within tolerance, which indicates that a peak has been located.

FIG. 3 shows the marker points jumped ahead to just before the next peak, based on known frequency.

FIG. 4 is a block diagram of an apparatus employed to implement the method illustrated in FIGS. 1–3.

FIG. 5 is a perspective view of an impulse ring, and a speed sensor which can be tested using the method of the invention.

FIGS. 6a–6b show a flowchart illustrating a method in accordance with the invention and carried out by the apparatus of FIG. 1.

DETAILED DESCRIPTION OF THE PREFERRED EMBODIMENT OF THE INVENTION

Figure 6B:
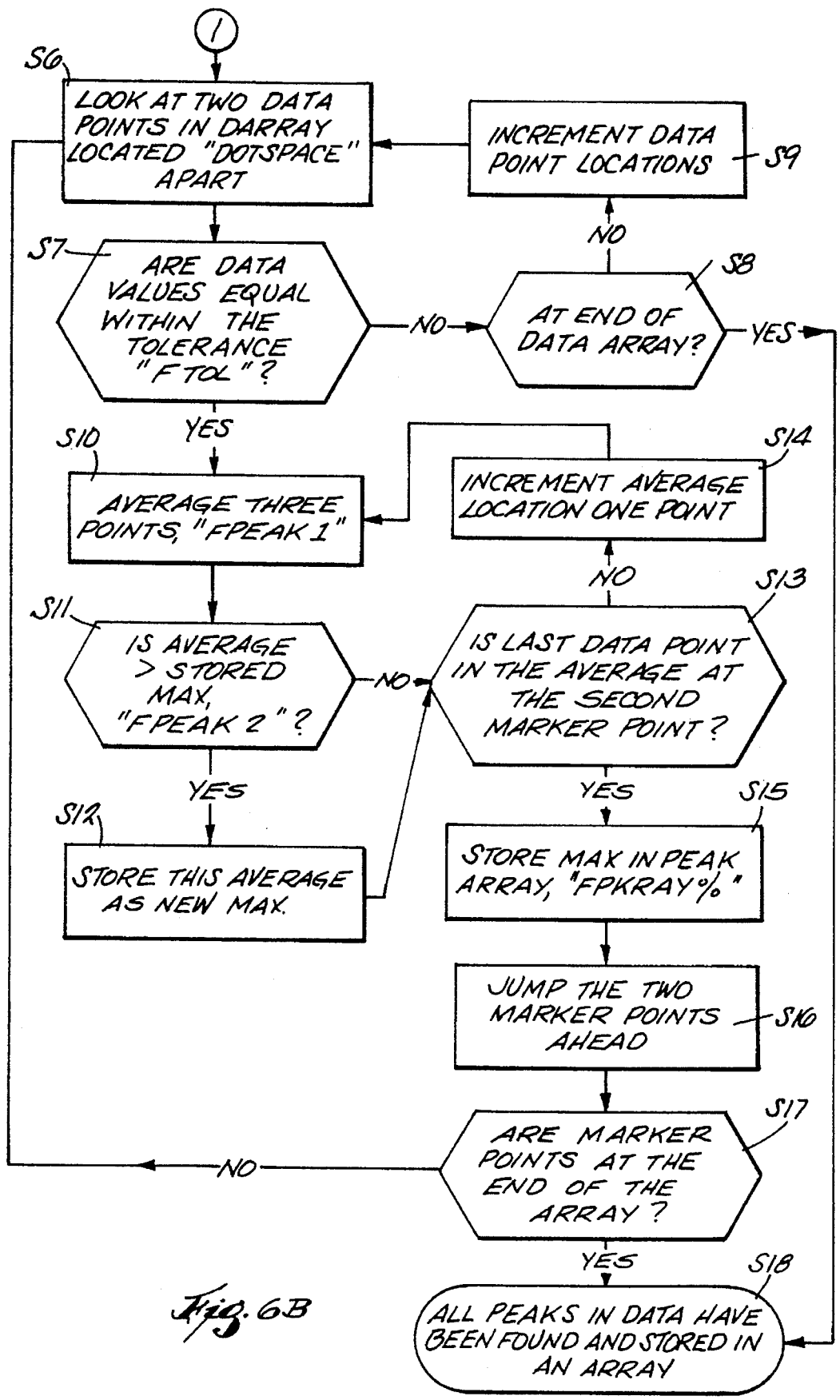

The invention provides a method and apparatus for detecting maxima and minima of an array of data points 8 defining a periodic, symmetrical waveform, or a substantially symmetrical waveform. The method and apparatus is capable of detecting maxima and minima for a distorted sinusoid as well as for a normal sinusoid. The method comprises comparing the "y" values of two marker points 9 (selected from the array of data points), which marker points are spaced apart in the "x" direction by a predetermined number of data points (see FIGS. 1–3). In one embodiment of the invention described below in more detail, the method is used to test a speed sensor 22, and the "x" axis shown in FIGS. 1–3 represents time, and the "y" axis shown in FIGS. 1–3 represents voltage output by the sensor. If the "y" values of the two marker points are not substantially the same, both marker points are incremented in the "x" direction, and their "y" values are tested again. If the "y" values are substantially the same, within a predetermined tolerance value t, a positive or negative peak has been found (see FIG. 2). Optionally, the points between the marker points 9 are then sorted to find the tip of the peak. In a more particular embodiment of the invention, after a peak has been found, assuming that the waveform has a known frequency, the marker points can be jumped ahead to just before the next peak (see FIG. 3).

In the preferred embodiment, this positive and negative peak information is used to determine a peak to peak amplitude for testing sinusoid generating components. If the maximum peak to peak amplitude is greater than a predetermined threshold, the component is rejected. (In an alternative embodiment of the invention, if the minimum peak to peak amplitude is lower than a predetermined threshold, the component is rejected.) An example of a component that is tested by measuring peak to peak amplitudes is a speed sensor, such as a speed sensor used in connection with anti-lock brakes. An example of such a speed sensor used in connection with anti-lock brakes is sold by the assignee of the present invention as SSI Part Number C5305.3 and is illustrated in FIG. 5.

Shown in FIG. 4 is a system 10 for locating positive peaks and negative peaks.

The system 10 comprises logic circuitry. In the preferred embodiment, the system 10 comprises a microprocessor driven computer 12, although a simpler device employing a microprocessor or other logic circuitry can be employed. While various types of computers can be used, in the illustrated embodiment an IBM compatible personal computer is used having an INTEL 8088, 8086, 286, 386, 486, Pentium, or higher microprocessor or a clone thereof (such as a Cyrix or AMD clone). In other embodiments, the computer includes a Motorola microprocessor or other microprocessor. The computer 12 is a typical personal computer including random access memory (RAM) (not shown), read only memory (ROM) (not shown), hard drive, one or more floppy disk drives, slots for receiving cards, and busses (e.g., data, address, graphics busses). The system 10 further includes a monitor 14 having a screen, or an alternative output device 16 such as a printer, sound card, buzzer, flashing light, or any other means of conveying that a component is acceptable or not acceptable. The system 10 further includes an analog to digital converter (A/D converter) 18 having a digital output connected to the computer 12, and having an analog input connected to a sinusoid generator 20. While various other analog to digital converters can be employed, in the illustrated embodiment the analog to digital converter 18 is a Burr Brown PCI-20091W-1.

The sinusoid generator 20, in the preferred embodiment of the invention, is a vehicle wheel speed sensor 22 shown in FIG. 5. The speed sensor 22 includes a magnetic pickup 24 which is positioned in close proximity to teeth 26 of a serrated impulse rotor 28. Such impulse rotors 28 typically have 50 teeth, and, when rotated, cause the speed sensor 22 to generate a sinusoid having 50 cycles for every one rotation of the impulse rotor 28. In normal operation, the impulse rotor 28 would be fixedly mounted on an axle of the vehicle, and the speed sensor is used to detect the rotational speed of a wheel of a vehicle to control an anti-lock braking system or a four wheel drive system. In the preferred embodiment of the invention, however, the serrated impulse rotor 28 is located in a testing facility and is arranged to selectively rotate at a desired speed, such as a fixed speed, for a test of a sensor 22. More particularly, in one embodiment of the invention, for each speed sensor 22 that is tested, the serrated impulse rotor 28 is rotated one revolution at a fixed speed to generate a sinusoid which is evaluated by the computer 12 to determine whether the tested speed sensor 22 is acceptable.

The system 10 and method provides an indication, such as a visual or audio indication, as to whether the sinusoid generating component 20 is acceptable or not. For example, in one embodiment, if the sinusoid generating component 20 is acceptable, green is displayed on the screen of a computer monitor 14 (e.g., a portion of the screen or the entire screen turns green), and if the sinusoid generating component is not acceptable, red is displayed on the screen of the computer monitor (e.g., a portion of the screen or the entire screen turns red).

The system and apparatus can be used to detect maxima and minima information for various other purposes.

The computer 12 is programmed to carry out the method illustrated in FIGS. 6a and 6b and in accordance with the invention. The method illustrated in FIGS. 6a and 6b may be better understood if considered in conjunction with a corresponding programming listing included below, and in connection with the following description. While various computer programming languages can be employed, a high level programming language in employed in the preferred embodiment of the invention. More particularly, the BASIC programming language is employed in the preferred embodiment of the invention. It should be understood that the method in accordance with the invention could also be carried out with a hardwired circuit.

The method comprises the step, illustrated as S1, of defining an array of discrete data points each having "y" values, wherein their position in the array represents their "x" values, which data points correspond to the digitized output of the sinusoid generator. For example, if this array is called "DARRAY", then "DARRAY(3)" will represent a point 8 which is advanced in the "x" direction from a point 8 represented by "DARRAY(2)", and "DARRAY(2)" will represent a point 8 which is advanced in the "x" direction from the point represented by "DARRAY(1)". The value of "DARRAY(3)" will be the "y" value of the data point 8 represented by "DARRAY(3)"; the value of "DARRAY(2)" will be the "y" value of the data point 8 represented by "DARRAY(2)", etc. In other embodiments, this array can have two or more dimensions; e.g., "DARRAY(a,b)".

The method further comprises, after step S1, the step illustrated as step S2 of defining arrays. In this step, variables are defined as being arrays, and their dimensions (e.g., number of rows or columns of data that they can store) are set up. Variables that are defined in this step include an array "DIFRAY%" which holds peak to peak values, and an array "FPKRAY%" that holds individual peak readings. The symbol "%" immediately after a variable name indicates that the variable is an integer variable. An array that holds the input from the A/D converter is defined and dimensioned in step S1, above.

The method further comprises, after step S2, the step illustrated as step S3 of defining the number of readings between the marker points 9 in a variable "DOTSPACE". The marker points 9 are set to be spaced apart by a certain number of data points of the array of step S1 as they are advanced in the array of step S1. In the illustrated embodiment, the number of readings between the marker points 9 is set at 15; however, any appropriate value can be employed.

The method further comprises, after step S3, the step illustrated as step S4 of defining the tolerance t shown in FIG. 2. In the flowchart of FIGS. 6a and 6b, this tolerance is represented by a variable named "FTOL". In the illustrated embodiment, the tolerance is set at 5; however, any appropriate value can be employed.

The method further comprises, after step S4, the step illustrated as step S5 of setting up (initializing) other program variables. For example, one variable, "RDGS" is initialized with the number of readings that are stored in the array "DARRAY" described in step S1. In one embodiment of the invention, 13000 readings are stored in "DARRAY" for one rotation of the 50 tooth impulse rotor 28 operating on a tested speed sensor 22. Another variable, "FPEAK1", which represents the current value of a rolling average of three points to find the tip of a peak, is initialized to zero. Another variable, "FPEAK2", which represents the largest value found in a search for a peak, is set to zero. Another variable, "PKPNTR", which represents the number of peaks found, is set to zero. Another variable, "PKPK", which represents a peak to peak value, is set to zero. Another variable, "MAXPK", which represents the maximum peak to peak value located, is set to a low value, such as zero. Another variable, "MINPK", which represents the minimum peak to peak value located, is set to a large value, such as 4000.

The method further comprises, after step S5, the step illustrated as step S6 of selecting as marker points 9 two of the data points 8 located "DOTSPACE" apart in the array "DARRAY". The first time step S6 is performed, the first marker point 9 will be located at the beginning of the array "DARRAY", and the second marker point 9 will be spaced apart from the first marker point 9, in the "x" direction, by a number of data points corresponding to the value in the variable "DOTSPACE".

The method further comprises, after step S6, the step illustrated as step S7 of determining whether the "y" values of the marker points are substantially the same, within tolerance t, as shown in FIG. 2. In other words, the step illustrated as step S7 comprises determining whether the absolute value of the data values between the marker points 9 selected in step S6 is less than or equal to the tolerance defined in the variable "FTOL". If so, a peak is located between the marker points 9, and the method proceeds to step S10. If not, there is no peak between the marker points 9, and the method proceeds to step S8.

The method further comprises the step illustrated as step S8 of determining whether the end of the array "DARRAY" has been reached by the marker points. If so, the method proceeds to step S18. If not, the method proceeds to step S9.

The method further comprises the step illustrated as step S9 of advancing the marker points 9 along the array "DARRAY". After performing step S9, the method proceeds to step S6.

The method further comprises the step illustrated as step S10 of averaging three successive data points between the marker points and storing the result in the variable "FPEAK1". The first time this step is performed, the three successive data points are points immediately following the first marker point 9 (i.e., immediately following the leftmost of the marker points 9 shown in FIG. 2). In the illustrated embodiment, three data points are averaged to help eliminate the effects of electrical noise. In other embodiments, more than three points can be averaged, or individual points can be examined (e.g., an individual point, instead of the average of three points, can be stored in "FPEAK1" in this step). For simplicity, steps S11 through S14 will be described under the assumption that three data points are averaged. Steps S11 through S14 are easily adjusted depending on whether more data points are averaged, or whether individual points are examined.

The method further comprises, after step S10, the step illustrated as step S11 of determining whether the average "FPEAK1" determined in step S10 is greater than the stored maximum peak "FPEAK2". If so, the method proceeds to step S12. If not, the method skips step S12 and proceeds directly to step S13.

The method further comprises the step illustrated as step S12 where this average "FPEAK1" determined in step S10 (the latest time step S10 was performed) is stored in "PFEAK2" as the new maximum peak. The method proceeds to step S13 after step S12 is performed.

The method further comprises the step illustrated as step S13 of determining whether the three successive data points described in step S10 have reached the second marker 9 (i.e., determining whether the rightmost of the three successive data points has reached the rightmost of the marker points 9 shown in FIG. 2). If so, the method proceeds to step S15. If not, the method proceeds to step S14.

The method further comprises the step illustrated as step S14 of moving the three successive data points described in step S10 to the right (in the view shown in FIG. 2) by one data point. In other words a new set of three successive data points is used, which new set includes the two rightmost data points of the old set, and a new data point to the right of these two data points. The method proceeds to step S10 after executing step S14.

Steps S10 through S14 generally perform a sort through points located between the marker points to find the tip of the peak, after it has been determined in step S7 that the marker points straddle a peak.

The method further comprises the step illustrated as step S15 of storing the tip of the peak in the array of peaks "FPKRAY%".

The method further comprises, after step S15, the step illustrated as step S16 of jumping the two marker points 9 ahead (as illustrated in FIG. 3).

The method further comprises, after step S16, the step illustrated as step S17 of determining whether the marker points 9 have reached the end of the array "DARRAY" (i.e., determining whether the rightmost of the marker points 9 shown in FIG. 2 has reached the rightmost end of the wave shown in FIG. 2). If so, the method proceeds to step S18. If not, the method proceeds to step S6.

The method further comprises the step illustrated as step S18 of terminating and outputting results (e.g., turning the screen of the monitor 14 red or green to indicate that a tested component should be rejected or accepted).

To ensure that one of ordinary skill in the art will be enabled to practice the invention without any experimentation, a computer program that can be used in the system of the invention follows. The listing is an implementation using the programming language QUICKBASIC from Microsoft; however, in other embodiments of the invention, other computer programming languages can be employed. The BASIC programming language is supplied with most personal computer systems. While the listing illustrates the steps involved in locating positive peaks and negative peaks, it does not include input or output operations, which are easily supplied by one of ordinary skill in the art.

PROGRAM LISTING

```
'The program assumes the data array named Darray has been
'loaded with the data to be analyzed.
'Define arrays:
DEFINT A–E, G–Z              'define integer variables
DIM difray%(300)             'holds peak to peak values
DIN4 Darray(20000)           'holds input from high speed A/D
DEM fpkray%(500)             'holds individual peak readings
'dotspace = 15               'Dotspace is Number of readings separating two
                             'marker points
Ftol = 5                     'Ftol is amplitude difference between "equal"
                             'sort points
                             'Define other variables:
rdgs = 13000                 'Rdgs is number of readings stored in Darray
Fpeak1 = 0                   'holds current value of rolling average
Fpeak2 = 0                   'largest value found in peak search
pkpntr = 0                   'records number of peaks found
pkpk = 0                     'pkpk holds difference values from fpkray%
maxpk = 0                    'max peak to peak value, initialize to low value
Minpk = 4000                 'smallest peak to peak value,
                             'initialize to large value
                             'Sort through readings stored in Darray. First find a
                             'straddle of a peak.
                             'A straddle point is reached when the first marker
                             'point, Darray(I),
                             'is equal to the second marker point,
                             'Darray(I + dotspace),
                             'within the specified tolerance, Ftol
15 FOR I = 1 TO (rdgs – dotspace)
IF ABS(Darray(I) – Darray(I + dotspace)) > Ftol THEN GOTO 30
                             'When the program gets to this section the two
                             'marker points are straddling a peak.
                             'The following routine uses a rolling average of
                             'three points to find the tip of the peak.
                             'Fpeak1 holds the rolling average value being
                             'evaluated. Fpeak2 stores the largest value that
                             'has been found.
16 FOR j = I TO (dotspace + 3)
Fpeak1 = (Darray(I + j) + Darray(I + j + 1) + Darray(I + j + 2))/3
IF ABS(Fpeak1) > ABS(Fpeak2) THEN Fpeak2 = Fpeak1
NEXT j
                             'A peak in the data has been found. Store the peak
                             'value in fpkray%().
fpkray%(pkpntr) = Fpeak2     'Fpeak2 has tip of current peak being analyzed
pkpntr = pkpntr + 1
Fpeak2 = 0                   'Clear Fpeak2 to get ready for next peak
                             'The following statement accomplishes the marker
                             'point move ahead function.Here the distance moved
                             'is a multiple of the marker spacing. It could be
                             'any suitable number.
I = I + (5 * dotspace)       'after a peak has been found, skip data on "side"
                             'of sine wave and jump ahead toward next peak
30 NEXT I                    'go back and compare next set of marker points
                             'All of the peak points in Darray have been found
                             'and their values stored in array fpkray%(). Now
                             'compare adjacent peaks to find the maximum
                             'and minimum peak-to-peak amplitudes.
FOR I = 1 TO (pkpntr – 1)
pkpk = ABS(fpkray%(I) – fpkray%(I + 1))
IF pkpk > maxpk THEN maxpk = pkpk
IF pkpk < Minpk THEN Minpk = pkpk
13 NEXT I
```

While the preferred embodiments of the invention have been shown and described, it will be obvious to those skilled in the art that changes and modifications may be made therein without departing from the spirit of the invention, the scope of which is defined by the appended claims.

I claim:

1. A method comprising the steps of:

(a) generating a periodic waveform which is substantially sinusoidal;

(b) digitizing the periodic waveform to define an array of discrete data points, which array represents "x" and "y" values of points along the periodic waveform;

(c) defining two marker points among the data points, which marker points are spaced a first predetermined number of data points apart in the "x" direction;

(d) comparing the "y" values of the marker points selected from the array of data points;

(e) indicating that a peak has been found if the difference of the "y" values of the marker points is less than a predetermined threshold;

(f) sorting points between the marker points to locate the tip of the peak, including (g) determining the average of a plurality of sequential "y" values and comparing said average with a previously determined average; and (h) advancing each marker point in the "x" direction by a second predetermined number of data points.

2. An apparatus for locating a peak in a sinusoid, said apparatus comprising:

a sinusoid generator;

an analog to digital converter having an input connected to said sinusoid generator and having an output, said analog to digital converter digitizing the output of the sinusoid generator;

means, connected to the output of said analog to digital converter, for defining an array of discrete data points, which array represents "x" and "y" values of points along the sinusoid, wherein the "x" value of each data point is represented by the location of the data point within the array;

means for defining two marker points among the data points, which marker points are spaced apart in the "x" direction;

means for determining whether the difference of the "y" values of the marker points is less than a predetermined threshold;

means for sorting points between the marker points, after said determining means determines that the difference of the "y" values of the marker points is less than the predetermined threshold, to thereby locate the tip of the peak, said sorting means including means for determining the average of a plurality of sequential "y" values, and for comparing said average with a previously determined average; and means for advancing each marker point in the "x" direction and again determining whether the difference of the "y" values of the marker points is less than the predetermined threshold.

* * * * *